United States Patent [19]

Bauer et al.

[11] Patent Number: 4,734,918
[45] Date of Patent: Mar. 29, 1988

[54] LUMINOUS BAND DISPLAY DEVICE

[75] Inventors: Karl-Heinz Bauer; Reinhold Wolf, both of Bad Neustadt/Saale, Fed. Rep. of Germany

[73] Assignee: Preh Elektrofeinmechanische Werke Jakob Preh Nachf. GmbH & Co., Bad Neustadt/Saale, Fed. Rep. of Germany

[21] Appl. No.: 611,095

[22] Filed: May 17, 1984

[30] Foreign Application Priority Data

May 17, 1983 [DE] Fed. Rep. of Germany ....... 3317807

[51] Int. Cl.⁴ .................. G01J 5/04; G02D 6/00; G05D 25/00
[52] U.S. Cl. .................. 374/131; 116/202; 340/57; 340/84; 350/96.24; 374/208
[58] Field of Search ............... 338/196, 227; 116/324, 116/DIG. 26, 323, 202, 332, 244, 278, 286; 350/96.24; 374/141, 131; 340/815.31, 984

[56] References Cited

U.S. PATENT DOCUMENTS

| | | | |
|---|---|---|---|
| 1,711,981 | 5/1929 | Andres | 116/324 |
| 2,613,630 | 10/1952 | McNaury | 116/332 X |
| 3,677,619 | 7/1972 | MacKenzie | 116/DIG. 26 |
| 3,857,361 | 12/1974 | Gibson et al. | 116/244 |
| 3,916,368 | 10/1975 | Post | 338/196 |
| 3,936,795 | 2/1976 | Nishioka | 116/202 |
| 3,983,688 | 10/1976 | Kockinos | 350/96.24 X |
| 4,139,949 | 2/1979 | Goldman | 116/DIG. 26 |
| 4,173,941 | 11/1979 | Castagna | 116/323 |
| 4,410,873 | 10/1983 | Kuratani | 338/196 |

FOREIGN PATENT DOCUMENTS

| | | |
|---|---|---|
| 1252782 | 10/1967 | Fed. Rep. of Germany . |
| 1690329 | 5/1971 | Fed. Rep. of Germany . |
| 2442876 | 3/1976 | Fed. Rep. of Germany . |
| 7834882 | 4/1979 | Fed. Rep. of Germany . |
| 3109868 | 10/1982 | Fed. Rep. of Germany . |
| 2417084 | 9/1979 | France ........................ 116/DIG. 26 |

*Primary Examiner*—Daniel M. Yasich
*Attorney, Agent, or Firm*—Woodcock Washburn Kurtz Mackiewicz & Norris

[57] ABSTRACT

A luminous band display device is shown for the thermometer scale-like display of the position of a control, e.g., of a turning knob or slide, having a series of luminous segments arranged in a circular or straight pattern. The luminous segments are formed by the ends of light guides which are led out from a generally cylindrical luminous center in a star-shaped or similar pattern. The luminous center consists of a cylindrical socket receiving a light source, and a cover which carries at least one color band and which can be rotated relative to the socket by means of the control is located between the light source and the beginning of the light guide. The light guides are arranged over approximately three fourths of the circumference of the luminous center. In order for all luminous segments of the entire display scale to light in only one color even in the stop positions of the control, an outlet opening and a guide for the color bands projecting from the socket are provided.

26 Claims, 11 Drawing Figures

Fig. 11

LUMINOUS BAND DISPLAY DEVICE

FIELD OF THE INVENTION

The present invention relates to luminous band display devices, and in particular devices for the thermometer scale-like display of the position of a control which is adjusted for controlling an operating condition.

DESCRIPTION OF THE PRIOR ART

Luminous band display devices are used as analog displays in a great number of applications, and particularly as numeric and alphanumeric display units in nearly all segments of electrical engineering and electronics. For example, a luminous strip is used for the display of a measured voltage in measuring instrumentation. The length of this luminous strip which is proportional to the measured voltage may consist of numerous luminous segments placed next to each other which are connected with an exciting voltage via corresponding electronic switches.

Circuitry for a thermometer dial-like display is known from DE-AS [West German Auslegeschrift] No. 24 42 876, published Mar. 18, 1976. This circuitry consists of several light-emitting diodes connected in the same sense, which are fed from a constant power source. The light-emitting diodes are driven by a parallel-connected switching transistor. The emitters of all switching transistors have a common connection which lies on the same potential as the cathode of the last light-emitting diode, which potential can be varied by means of a voltage follower circuit. The base no-load voltage of each switching transistor is set by two resistors connected as voltage dividers, and the base no-load voltages differ from one another by a small discrete amount. A separate light-emitting diode is needed for each luminous segment with this display.

Only a single light source is needed in the illuminating device for a push-button arrangement known from DE-AS [West German Auslegeschrift] No. 16 90 329, published May 13, 1971. A light guide block is led from the light source to the individual switches, which block is flat on the switch side and which is provided with reflector surfaces on the opposite side, which project the rays to the flat side. The reflector surfaces become larger with increasing distance from the light source, and they are staggered relative to one another. If a push-button is pressed, the arrangement provides that light rays reach the push-button from the light guide block, and a certain area of the push-button is illuminated.

A switching position indicator for electric ovens is already known from DE-AS [West German Auslegeschrift] No. 12 52 782, published Oct. 26, 1967. Light rays are coupled from a light source, one side of which is shielded by a reflector, so as to reach several light guides. The light guide outlets are placed next to each other as a display scale and are arranged in three parallel rows, one on top of another. Screen disks are attached in a torsion-proof manner to a shaft that can be rotated by means of a twist grip, so as to shield light guide inlets from receiving the source light rays.

A push-button assembly is described in DE-OS [West German Offenlegungsschrift] No. 31 09 868, published Oct. 7, 1982, which has several push-buttons which mutually release each other by means of a blocking rail. Also, a luminous display device is present for each of the push-buttons pressed. These consist of a luminous center with a light source arranged in a hollow space from which several light guides are led out in a star-shaped pattern. One of the ends of the light guides lights up when one of the corresponding push-buttons is pressed. If the push-button is not pressed, part of the push-button is positioned within the respective light guide, thereby interrupting the light rays, so that the end of the light guide appears dark. If several push-button assemblies are arranged next to each other, the light guides in several planes can also be carried by the same luminous center. The ends of the light guides are arranged next to each other in several rows corresponding to the push-button rows.

An adjustable rheostat is known from DE-GM [West German Prototype] No. 78 34 882 published Apr. 19, 1979, in which the position of the slide contact of the spring carrier can be displayed by a luminous display device. This luminous display device consists of a luminous center with a light source arranged in its hollow space, where light guides whose ends, located next to each other, represent a display scale, are led out in a star-shaped pattern. The hollow space forms a kind of a socket. Between the wall of the socket and the light source there is a hollow cylinder-shaped rotary part which has a recess in its wall, the dimension of which recess corresponds approximately to one light inlet. The rotary part consists of a material nontransparent to light, while the recess acts as a light outlet. A cover which is unicolor or multicolored can be inserted into the recess. The light can reach the light guide only precisely where the recess is located. Thus, only punctiform display is possible in which a luminous spot can migrate along the display scale depending on the position of the slide contact.

SUMMARY OF THE INVENTION

It is an object of the present invention to create a luminous band display device in which all the luminous segments of the entire display scale are enabled to light up in one color when the control is moved to either one of the stop positions.

In accordance with the object of this invention, there is provided a luminous band display device having a plurality of luminous segments arranged in a row, the segments being formed by the ends of light guides which communicate to a luminous center having a light source and a surrounding transparent socket, the display device having a cover around the light source which is rotatable by means of a control member such as a turning knob or a slide so as to be movably positioned between the light source and the light guide inlets, the cover having at least one color band fixed thereon to modify the light that reaches certain ones of the inlets, the color band having a length to at least permit covering of all the light guide inlets with at least one outlet opening to permit extension of the color band away from the cover and a guide for guiding same to and from the cover.

If the luminous bands were only made long enough to cover half the circumference of the cover without overlapping, only somewhat more than half the range of rotation could be covered with one color at any time, because, e.g., the entire range of rotation is smaller than 360°. Similar conditions apply to the linear or sliding range as well. Through the design of the device with the extended, led-out color bands according to the present invention it is thus possible to display the entire sliding or rotation range with only one color. For example, when the control member is at one end or stop, the luminous segments light up only in red color, while at the other stop they may appear wholly in blue color; at control settings in between the two stops, both colors appear.

The present invention will be described below in more detail for several illustrative embodiments based on the drawings.

DESCRIPTION OF THE PREFERRED EMBODIMENTS

Basically two embodiments of a luminous band display device are shown in the Figures. A circular arrangement of the luminous segments 4, which are formed by the ends of the light guides 3, is illustrated in FIGS. 1 through 7. FIGS. 8 through 11 show a straight, or linear arrangement. Both the circular and the straight luminous band displays are part of a setting or control device as used, e.g., for displaying the heating and ventilation system in automobiles. These setting devices have a turning knob 2 (FIG. 1) in the case of the circular arrangement of the luminous segments, or a slide 16 (FIG. 8) in the case of the straight arrangement, for the usually indirect operation of the adjusting members. The adjusting members can be, for example, mechanical or electrical components, such as flaps or motors. Indirect mechanical operation is typically carried out via toothed racks, toothed gears, cord drives, Bowden cables, etc., while potentiometers or switches are used in the case of indirect electrical operation. The adjusting members are operated by the turning knob or the slide, and their position is transmitted to the electrical adjusting member by means of the tapped voltage. Accordingly, there are a great number of embodiments for the luminous band display device of this invention which is described below essentially on the basis of two illustrative examples.

Figure 1:
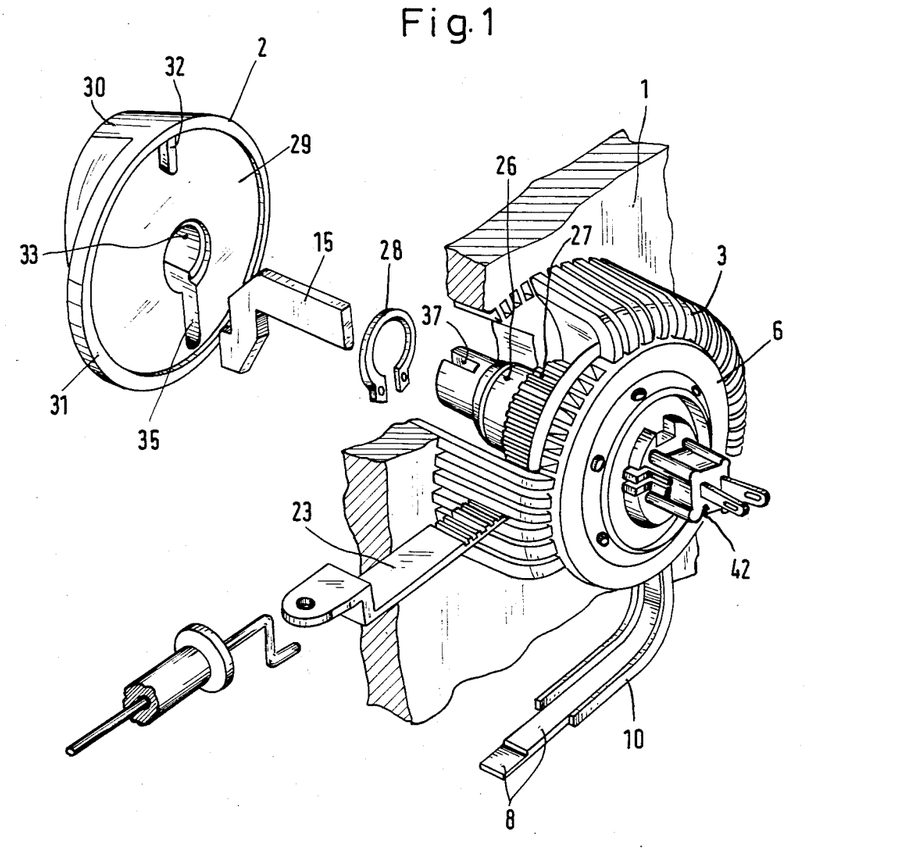
FIG. 1 shows an exploded view of a luminous band display device with a turning knob.

FIG. 1 shows the application of a circular arrangement of the luminous segments in an exploded view. A front plate made of plastic is designated by the numeral 1; this front plate is part of a larger device or of a larger mechanism. In the front plate there is located a circular opening in which a hollow cylindrical shaft 26 is mounted in a rotatable manner. Shaft 26 carries a gear 27 of somewhat larger diameter, and whose part opposite the shaft serves as a stop at the front plate 1. On the outer side of the front plate the shaft 26 is secured against axial displacement by a retaining ring 28 or by a tip-stretched snap hook (not shown).

The turning knob 2 consists of a disk-shaped base part 29 to which a grip 30 is molded. The base part 29 has a peripherally extending, somewhat raised border 31. Radially to the inside there extends from this border a short, web-like projection 32 which interacts with two projecting catches 36 of the front plate as a rotation range limiter. These catches 36 are located, as is seen in FIG. 4, approximately at the same radius as projection 32, but are angularly displayed relative to each other corresponding to the desired range of rotation.

Figure 3:
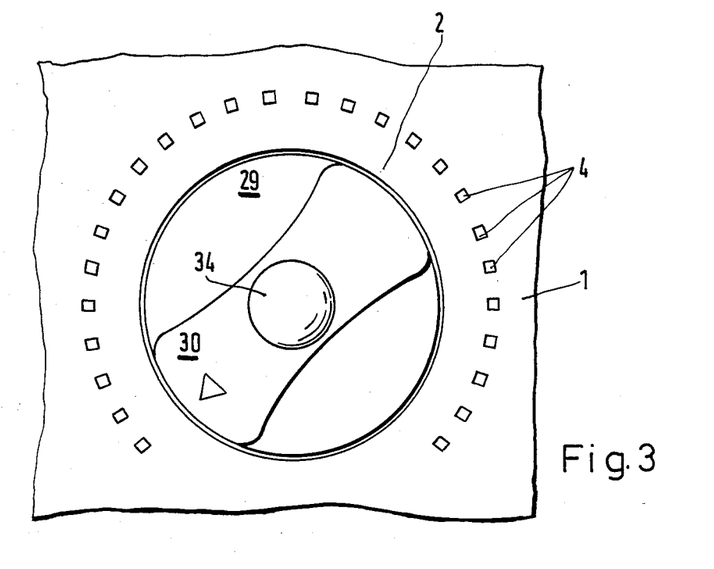
FIG. 3 shows a front view of the luminous band display device.

Referring also to FIG. 3, in the center of base part 29 of turning knob 2 there is a cavity 33 which continues into the grip 30 and which is closed on the front side of the grip by a window 34 made of a transparent material. The window can be provided with display symbols. A slot 35 in the base part extends radially from the cavity 33 and, in the vicinity of the border 31, includes a breakthrough to the front side of the grip. An insert 15, which is made of a light-conducting material, is introduced into the cavity 33, the slot 35 and the breakthrough. As is apparent from FIG. 1, this insert 15 is bent several times and is provided with bevels to deflect the light rays through to the front window. The turning knob proper, on the one hand, and the rotational position, on the other hand, are made visible by the light visible in the window 34 and in the breakthrough, even in darkness.

The shaft 26 has two diametrically opposite notches 37 (FIG. 1) on the front side. The insert 15 enters into one of the notches, and a tip-stretched elevation, not shown in the Figures, which reaches into the cavity 33, reaches into the other notch on the opposite side. To fasten the turning knob on the shaft the elevation and the notch are designed in such a way as to form a close sliding fit with snap-in effect.

Figure 2:
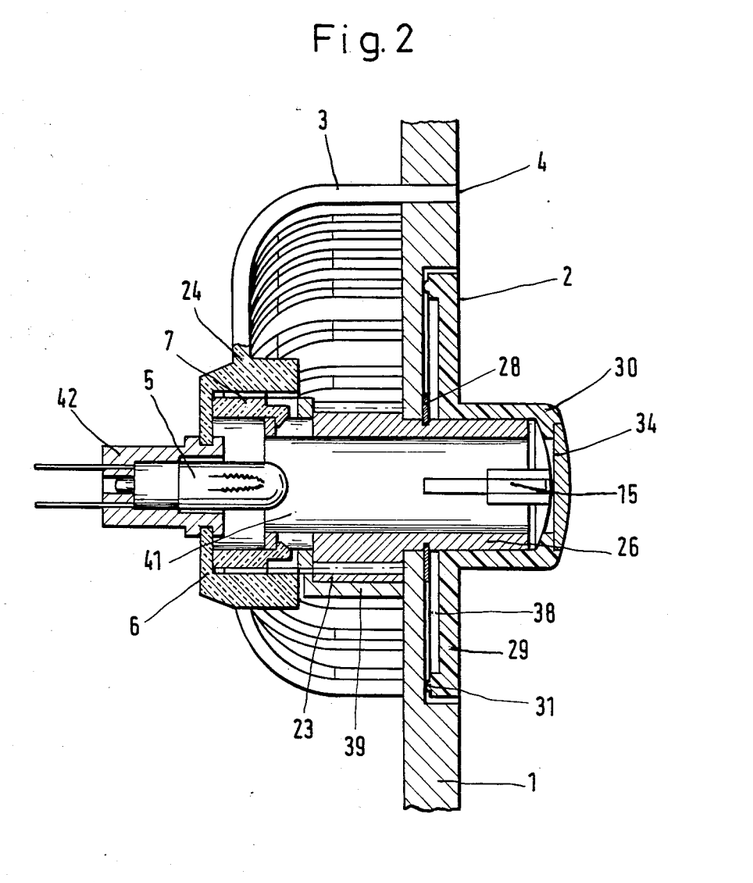
FIG. 2 shows a sectional side view of the luminous band display device.
Figure 4:
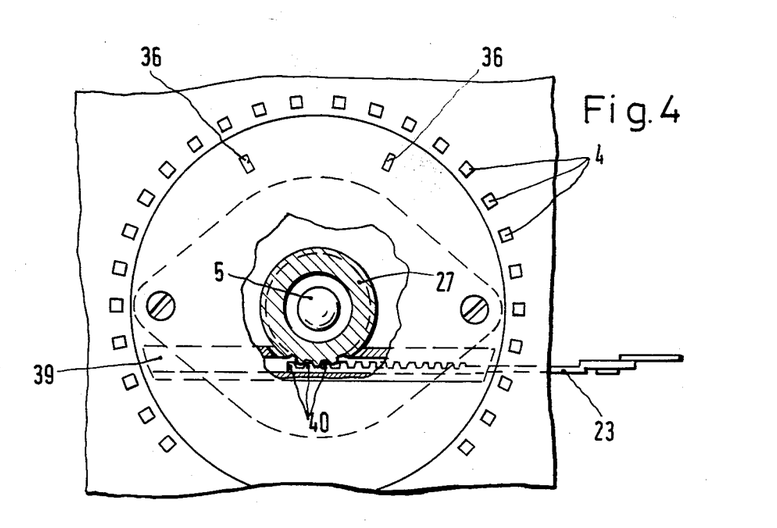
FIG. 4 shows a front view of the front plate without turning knob, but with the rear toothed rack and with the guide web.

As is apparent from FIGS. 2 and 4, there is a circular recess 38, whose diameter is slightly larger than the diameter of the base part 29 of the turning knob 2, in the outer side of front plate 1. The catches 36 and the retaining ring 28 are located on the surface of this recess, and the border 31 of the turning knob slides on the recess surface, or bottom. The depth of the recess and the height of the border 31 are selected in such a way as to have the top side of the base part of the turning knob located approximately flush with the surface of the front plate 1.

In the immediate vicinity of the shaft bearing opening in the back side of the front plate, there is located a tip-stretched guide rail 39 with a through guide chamber for accommodating a toothed rack 23 slidable therein. The guide rail is shown in broken line in FIG. 4, because it is arranged on the back side of the front plate. One side of the toothed rack is provided with teeth 40 over a certain section of its length, which teeth mesh with the teeth of the gear 27 through a cut-out in the guide chamber. When the shaft is rotated, the toothed rack is displaced, and adjusting members or slide switches, which in turn set one or more electrical adjusting members into motion electrically, are actuated via a cord or Bowden cable.

Figure 5:
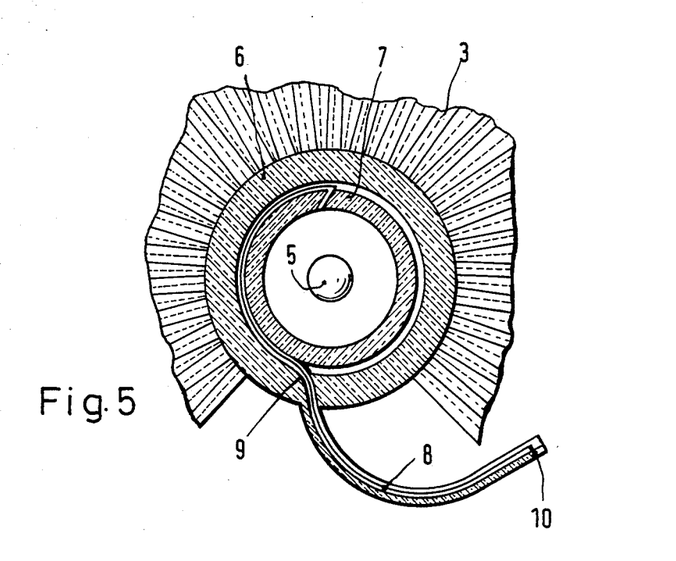
FIG. 5 shows a section through the luminous center with a color band.
Figure 6:
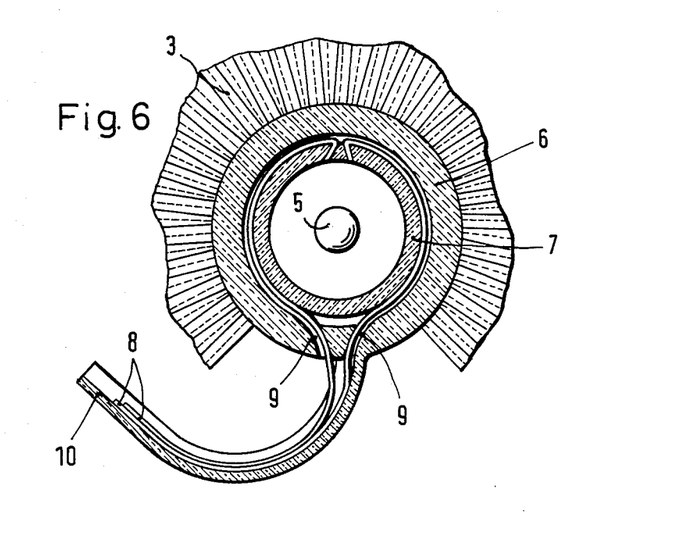
FIG. 6 shows a section through the luminous center with two color bands.

In FIGS. 5-6 is shown a cover 7, which is made of a glass-clear material, is attached to the shaft 26, which in turn is made of a glass fiber-reinforced material in such a way that the shaft 26 is rotatable together with the cover 7. The cover can be glued or slipped onto the shaft with which it is connected slip-free, or it can be connected with it by a snap-in connection. The cover 7 is of pot shape and has a breakthrough 41 on its bottom, so that the light generated by a light source 5 reaches insert 15 of the turning knob 2 through the breakthrough. If a colored display of the turning knob is desired, the window 34 and/or the insert can be colored. It is also possible to insert a colored disk between the light source and the insert. It is also within the scope of this invention to have the shaft and the cover as one part made from a transparent, hard plastic, in which case they have a tubular design.

Figure 7:
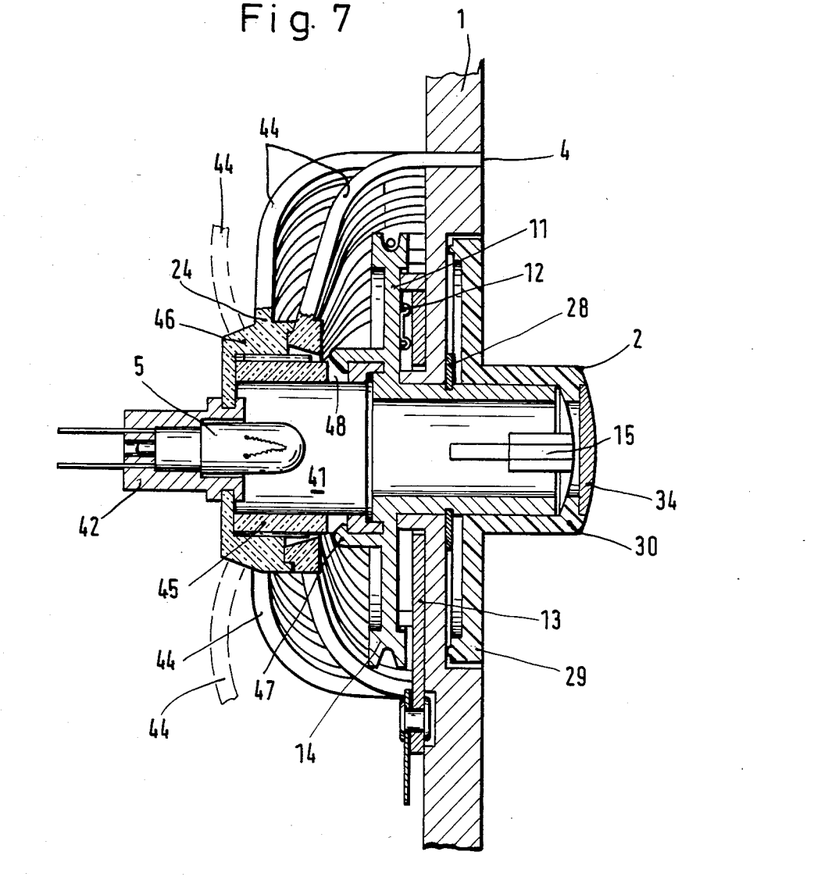
FIG. 7 shows a sectional side view of another luminous band display device with a directly coupled, adjustable resistor.
Figure 8:
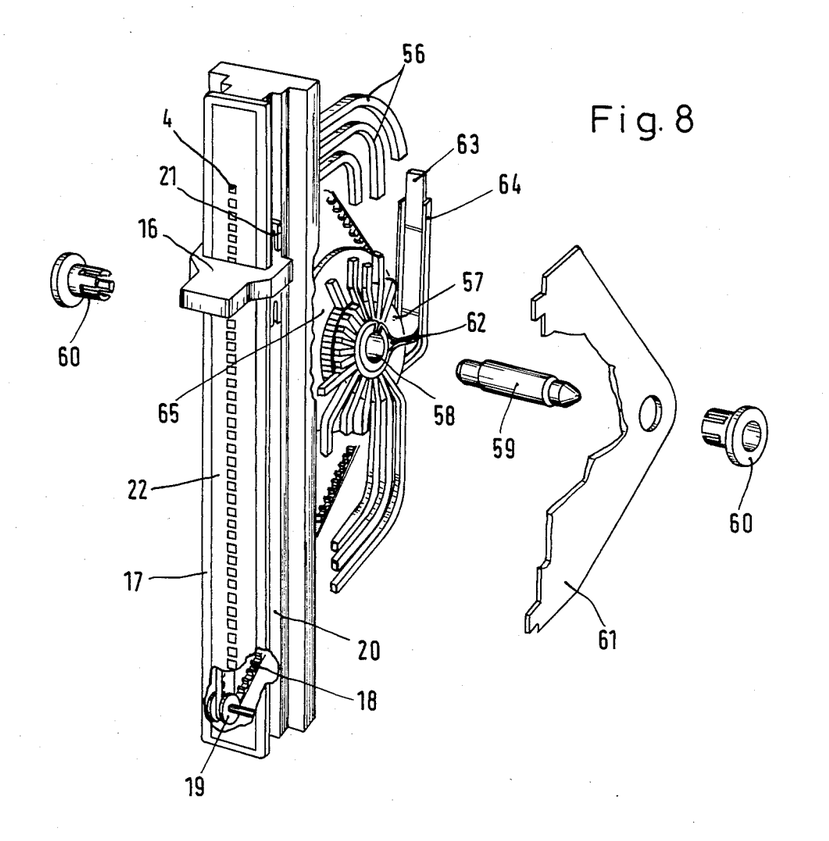
FIG. 8 shows an exploded view of another luminous band display device with a slide.
Figure 9:
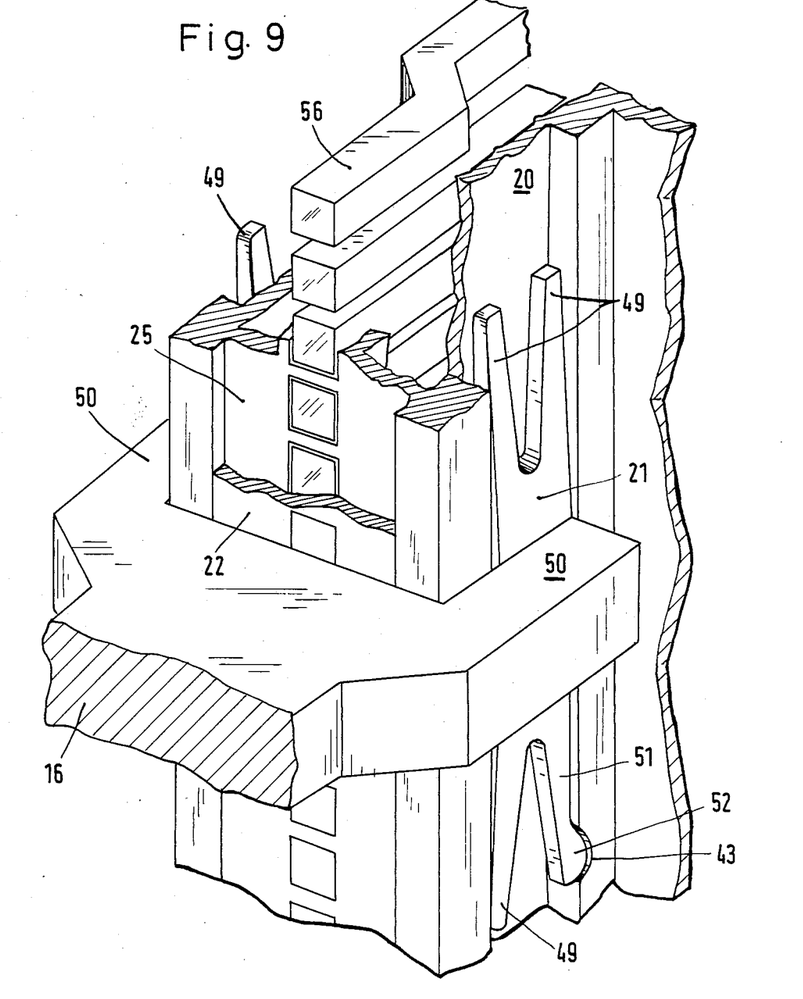
FIG. 9 shows an enlarged exploded detail of the guide rail with slide.
Figure 10:
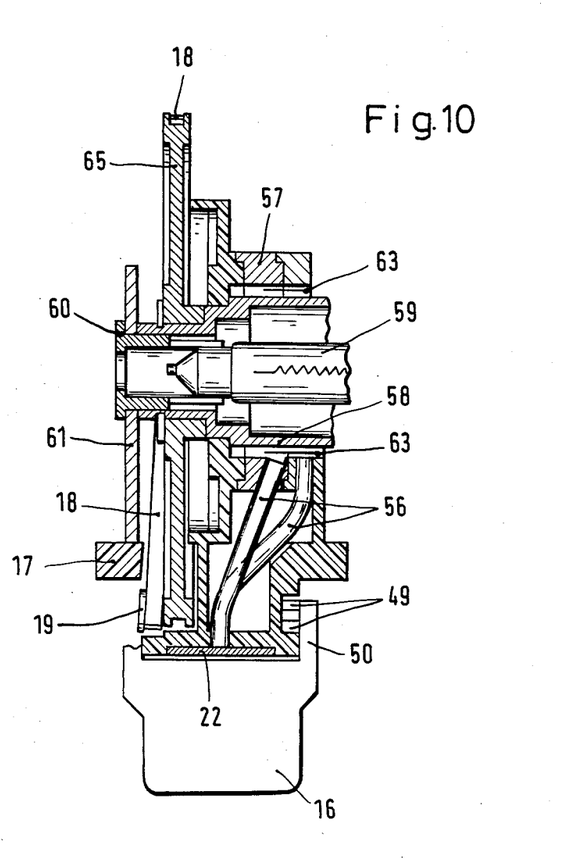
FIG. 10 shows a sectional side view of the device.

A light source 5, which is attached to a socket 6 through lamp socket 42, reaches into the cover 7. Socket 6 is also pot-shaped, and the cover reaches into it, i.e., is axially aligned with it. The socket is composed of several parts; the parts which are not to guide light consist of a material that is not transparent to light, while the parts which are to guide light consist of a light transparent material. The socket is fastened to the rear wall of the front plate by means of two pins which are not shown in the figures. Only the two set screws are visible in FIG. 4. The cover 7 and the socket 6 together form a luminous center from which the light guides 3 emanate radially outward. In the embodiment according to FIG. 2 the light guides are arranged to lead away from the source in one plane. The light guides in the embodiment according to FIG. 7 are arranged in several planes. A third plane is indicated there by broken lines.

Each light guide 3 has a light guide inlet 24 and a luminous segment 4, which represents the end of the light guide. As is apparent from FIGS. 3 and 4, the luminous segments are arranged in the front plate in a circular pattern or row, at a relatively great distance from each other, but only so that approximately three-fourths of the circle is covered. If a closer packing of the luminous segments is desired, the light guides are arranged in several planes, and their source ends are united. As used herein, the term "row" refers to either a circular or curvilinear pattern or a linear row, or to similar display arrangements.

Referring now to FIGS. 5 and 6, color bands 8 are attached to and around at least a portion of cover 7. FIG. 5 shows an embodiment with only one color band, while an example with two color bands is shown in FIG. 6. If there is only one color band, a plurality of the luminous segments are lit, corresponding to the position of the turning knob, in the color of the color band, while the remaining luminous segments light up in the color of the plastic, e.g., in white color, or in a light corresponding to the spectrum of the light source. If there are two color bands, e.g., red and blue, a first plurality of the luminous segments light up in red and the other plurality in blue, depending upon the knob position. It is thus easy to recognize, for example, how the heating and ventilation are set in an automobile, because of the movable red/blue display. Since it is desired that all luminous segments light in one color when the control is moved to either end stop position, each color band must be longer than the circumference of a half-circle, because the light guides extend over nearly three-fourths of the circumference of the circle.

In order to make it possible to use color bands of sufficient length, the socket 6 has one or more than one outlet openings 9 through which the color band or bands can exit from the socket 6. In order to prevent the color bands from being damaged, an arc-shaped guide 10 is provided, which can be tip-stretched, e.g., to the socket. The color bands are guided in this guide.

Another embodiment is shown in FIG. 7. Here, a spring carrier 11 which carries a slide spring 12 is coupled with the turning knob 2. This slide spring, made of metal, provides for good electrically conducting connection between a resistor strip and a collector strip of a potentiometer, both of which are applied on a resistor plate 13 made, e.g., of hard paper according to a known process. The corresponding terminating tabs are applied underneath on the resistor plate 13. The voltage that is tapped depending on the position of the turning knob is used directly to set an adjusting member. FIG. 7 also shows another embodiment in which an adjusting member may be set mechanically by means of a cord drive or electrically via a remote potentiometer via a cord pulley 14 used instead of the spring carrier 11.

In contrast to the above-described embodiment of FIGS. 1-6, in the embodiment of FIG. 7 the light guides 44 are arranged in two or (shown by broken lines) three levels around the periphery of socket 46. The ends of the respective light guides are arranged at the front plate to form a circular, single-row arrangement of their luminous segments. Two diametrically opposed snap hooks 47 are provided on the cord pulley, which hooks catch into the recesses 48 of the cover 45. The design otherwise corresponds to the embodiment described in FIGS. 1 through 6.

While the luminous segments are arranged in a circular pattern in the embodiments according to FIGS. 1 through 7, they form a linear display in the embodiments shown in FIGS. 8 through 11. A slide 16 is guided on an elongated guide rail 17. The front side of the guide rail 17, which is located between the slide arms 50, has a recess 25 in which is located a light-transparent cover plate 22. The thickness of the cover plate and the depth of the recess are suitably selected to be such that their surfaces are flush with each other.

Two longitudinal recesses 20 extending in the sliding direction are provided in the side walls of the front side. As is apparent from FIG. 9, web-like sliding bodies 21, which are molded to the sliding arms 50, are guided in the longitudinal recesses 20. These sliding bodies have expanding arms 49 at each end which press outward and guarantee good sliding motion of the slide. It is desirable in some cases to set the middle position of the slide by a catch. One of the two expanding arms, or both of them, may be adapted for this purpose by providing a flexible tongue 51 with a curved or spherical free end 52 which interacts with a recess 43 in the guide rail, as illustrated in the lower part of FIG. 9. When the end of the flexible tongue is outside of the recess, the flexible tongue acts as an additional braking member for the slide.

Figure 11:
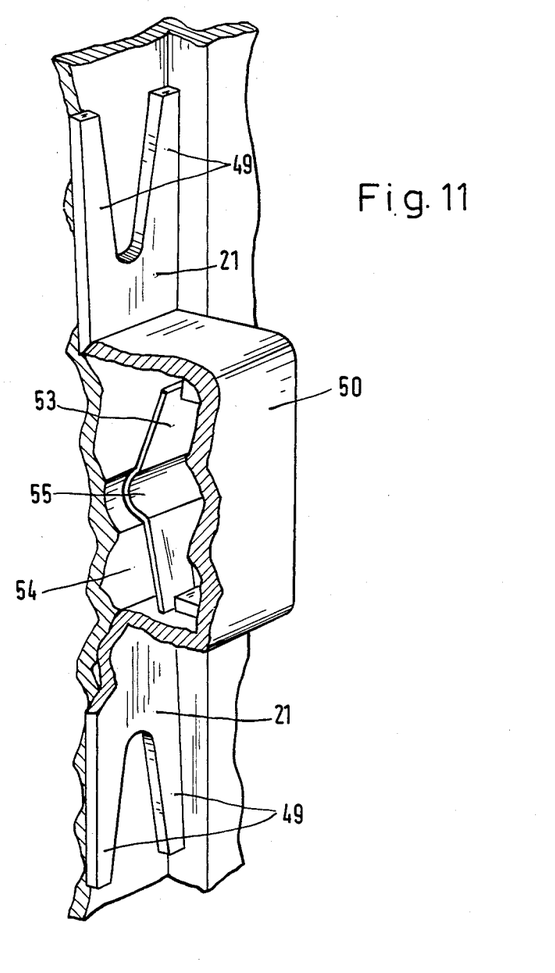
FIG. 11 shows an enlarged perspective cutaway of a slide with braking and locking member.

In an alternate embodiment illustrated in FIG. 11, instead of the tip-stretched flexible tongue there is employed a separate metal brake spring 53 carried in slide arm 50. A chamber 54 is provided for this purpose in the slide arm, in which the brake spring 53 is inserted. The brake spring has a convex portion 55 approximately in the center, which engages with a mating concave element on longitudinal recess 20, in order to provide a locking function.

The ends of light guides 56 form the luminous segments which are located underneath the light transparent cover plate 22. These light guides 56 are arranged either in one plane or in several planes. All light guides 56 originate from a luminous center which consists essentially of a socket 57 and of a rotatable, sleeve-like, light transparent cover 58 located in the cavity of the socket. A light source 59 is located in the center of the cover, which is held by a socket 60 on each side. These metal sockets also serve as power lead-in for the light source as well as for dissipating heat. For the exact positioning of the light source there is also provided a holding plate 61 which is attached to the guide rail 17. One of the two sockets is held in a breakthrough of the holding plate.

A cutout is provided for the outlet opening 62 for the two color bands 63 on one side of the socket 57 where there are no light guide outlets. A guide 64 which is connected with the socket is provided to ensure the definite deflection of the color bands.

An endless toothed belt 18, which is deflected on both sides by guide rolls 19, is guided in the longitudinal recess of the guide rail 17. In addition, the toothed belt 18 is also led over a pulley 65 which has a toothed rim on its circumference. If the slide 16 is moved, the pulley 65, which is also a spring carrier, e.g., for an adjustable resistor or for a rotary type switch, is also rotated. The toothed belt itself is held in the sliding body 21 between the expanding arms 49. The lower and upper stops for the slide are formed by the guide rolls 19 reaching into the longitudinal recesses, which guide rolls are hit by the expanding arms in the stop.

The pulley 65 is also a spring carrier in the embodiment shown in FIGS. 8 through 11. In another embodiment, the pulley has a gear which meshes with a toothed rack so that the toothed rack is displaced when adjusting the slide. For example, Bowden cables can be moved with this toothed rack.

We claim:

1. A luminous band display device for the thermometer scale-like display of the position of a control of an operating condition in a heating and ventilating system, the control being adjustable about its axis, comprising a plurality of light guides, each said light guide having an inlet end and an outlet end, the outlet ends of said light guides being arranged to form a row of luminous segments, luminous center means having a light source and a generally transparent electrical socket therearound, the inlet ends of said light guides being in optical connection with said luminous center means, cover means within said socket and between said light source and said inlet ends for modifying the light therefrom, means for rotating said cover means in accordance with the position of said control, at least one color filter, a portion of said color filter fixed on said cover means, the extent to which said color filter is fixed on said cover means being rotatably related to the position of said control, whereby said color filter intercepts and modifies light at a plurality of said inlet ends of said light guides corresponding to said control position, said color filter having a length corresponding to at least all of said light guide inlet ends, at least one opening in said socket for passing said color filter therethrough so that a portion of said color filter is outside said socket, guide means for guiding and projecting said color filter through said socket opening.

2. The luminous band display device in accordance with claim 1, characterized in that said electrical socket is generally cylindrical and said inlet ends of said light guides are arranged around only a portion of said socket circumference, said portion including at least about three fourths of said circumference.

3. The luminous band display device in accordance with claim 1, comprising an adjustable resistor carrying a slide spring and having a spring carrier, further characterized in that said control is a turning knob, and having catch means for making a functional connection of said turning knob with said spring carrier.

4. The luminous band display device in accordance with claim 1, comprising a rotary type switch carrying a slide spring and having a spring carrier, further characterized in that said control is a turning knob, and having catch means for making a functional connection of said turning knob with said spring carrier.

5. The luminous band display device in accordance with claims 3 or 4, characterized by a pulley connecting said turning knob and said spring carrier.

6. The luminous band display device in accordance with claims 3 or 4, characterized in that said turning knob has a light-transparent insert connected to and illuminated by the light source.

7. The luminous band display device in accordance with claims 3 or 4, characterized by a cord drive connecting said turning knob and said spring carrier.

8. The luminous band display device in accordance with claim 4, comprising means for slip-free connecting of said spring carrier with said cover.

9. The luminous band display device in accordance with claim 4, comprising means for slip-free connecting of a pulley with said cover.

10. The luminous band display device in accordance with claim 1 comprising a rotary type switch carrying a slide spring and having a spring carrier, said turning knob being directly coupled with said spring carrier.

11. The luminous band display device in accordance with claim 1, characterized in that said light guides are arranged in several planes around the periphery of said socket.

12. The luminous band display device in accordance with claim 11, characterized in that said light guides have respective paths whereby said luminous segments are positioned in one row.

13. The luminous band display device in accordance with claim 1, comprising a guided toothed rack operatively connected to an adjusting member, and wherein said control is in functional connection with said rack.

14. A luminous band display device for thermometer scale-like display of the position of a control of an operating condition in a heating and ventilating system, comprising a plurality of light guides, each said light guide having an inlet end and an outlet end, the outlet ends of said light guides being arranged to form a row of luminous segments, luminous center means having a light source and a generally transparent electrical socket therearound, the inlet ends of said light guides being in optical connection with said luminous center means, cover means within said socket and between said light source and said inlet ends for modifying the light therefrom, means for rotating said cover means in accordance with the position of said control, at least one color filter, a portion of said color filter fixed on said cover means, the extent to which said color filter is fixed on said cover means being rotatably related to the position of said control, whereby said color filter intercepts and modifies light at a plurality of said inlet ends of said light guides corresponding to said control position, said color filter having a length corresponding to at least all of said light guide inlet ends, at least one opening in said electrical socket for passing said color filter therethrough so that a portion of said color filter can be outside said socket, guide means for guiding and projecting said color filter through said socket opening, and a guide rail for guiding said control, whereby said control is a slide slidable in its longitudinal direction on said guide rail.

15. The luminous band display device in accordance with claim 14, characterized in that said slide is part of an adjustable resistor.

16. The luminous band display device in accordance with claim 14, characterized in that said guide rail has longitudinal recesses in opposite side walls thereof, and wherein said slide has web-like sliding bodies positioned in said recesses for guiding said slide.

17. The luminous band display device in accordance with claim 14, comprising a spring carrier with a pulley feature, and an endless tooth belt and guide rolls for guiding said belt, said endless belt being connected so that movement of said slide causes movement of said spring carrier.

18. The luminous band display device in accordance with claim 17, characterized in that said guide rolls comprise stop means for stopping said slide.

19. The luminous band display device in accordance with any of claims 15 through 18 or 14, characterized in that said guide rail has a light-transparent, longitudinal cover plate which covers said luminous segments.

20. The luminous band display device in accordance with claim 14, characterized in that the said guide rail has a front-side recess and said cover plate is inserted in said recess and is approximately parallel with its surface.

21. The luminous band display device in accordance with claim 14, comprising a braking member which cooperates with said slide.

22. The luminous band display device in accordance with claim 21, characterized in that said braking member is also a locking member for said slide.

23. The luminous band display device in accordance with claim 21, characterized in that said slide carries said braking member.

24. The luminous band display device in accordance with claim 23, characterized in that said braking member comprises a tip-stretched flexible tongue which serves for braking and/or locking.

25. The luminous band display device in accordance with claim 23, characterized in that said braking member comprises a braking spring inserted into said slide, said braking spring serving for braking and/or locking.

26. The luminous band display device in accordance with claim 14, characterized in that said slide is part of a switch.

* * * * *